United States Patent [19]

Tripathi et al.

[11] Patent Number: 5,654,897
[45] Date of Patent: Aug. 5, 1997

[54] METHOD AND STRUCTURE FOR IMPROVING PATTERNING DESIGN FOR PROCESSING

[75] Inventors: Prabhakar P. Tripathi, San Jose; Bruce Whitefield, Menlo Park; Chi-Hung Wang, San Jose, all of Calif.

[73] Assignee: LSI Logic Corporation, Milpitas, Calif.

[21] Appl. No.: 567,288

[22] Filed: Dec. 5, 1995

Related U.S. Application Data

[63] Continuation of Ser. No. 362,839, Dec. 22, 1994, Pat. No. 5,477,466, which is a continuation of Ser. No. 732,843, Jul. 19, 1991, Pat. No. 5,379,233.

[51] Int. Cl.[6] ................................................ G06F 17/50
[52] U.S. Cl. ................................................ 364/489; 364/488
[58] Field of Search .......................... 364/488, 489, 364/490; 430/5, 296, 311, 326; 250/492.2, 491.1

[56] References Cited

U.S. PATENT DOCUMENTS

| | | | |
|---|---|---|---|
| 4,520,269 | 5/1985 | Jones | 250/492.2 |
| 4,717,644 | 1/1988 | Jones et al. | 430/296 |
| 4,761,560 | 8/1988 | Glendinning | 250/492.2 |
| 4,812,962 | 3/1989 | Witt | 364/490 |
| 5,242,770 | 9/1993 | Chen et al. | 430/5 |

OTHER PUBLICATIONS

"Electron–Beam Proximity—A New High–Speed Lithography Method for Submicron Structures" by H. Bohlen et al, IBM J. Res. Develop., vol. 26, No. 5, Sep. 1982, pp. 568–579.

*Primary Examiner*—Vincent N. Trans
*Attorney, Agent, or Firm*—Oppenheimer Poms Smith

[57] ABSTRACT

A method of interactive feedback in semiconductor processing is provided which compensates for lithographic proximity effects, reactive ion etch loading effects, electromigration and stress due to layering.

29 Claims, 3 Drawing Sheets

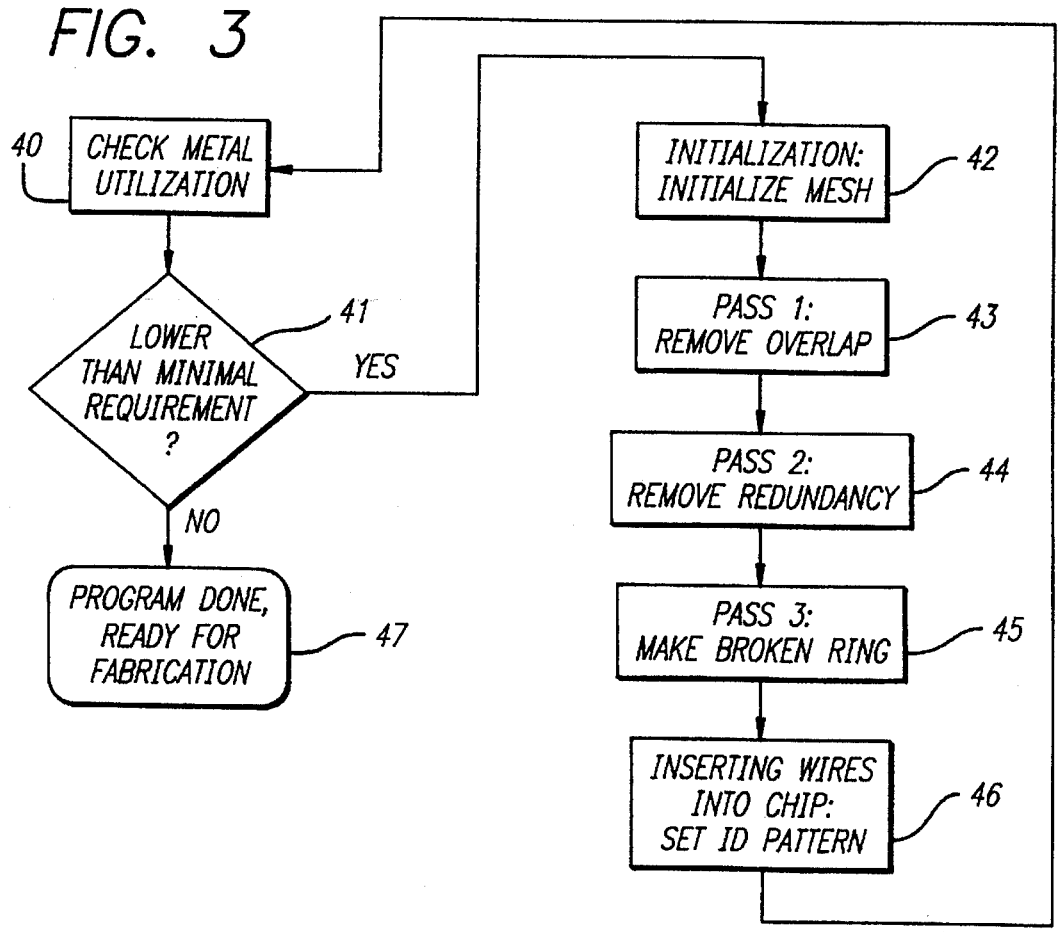
FIG. 3
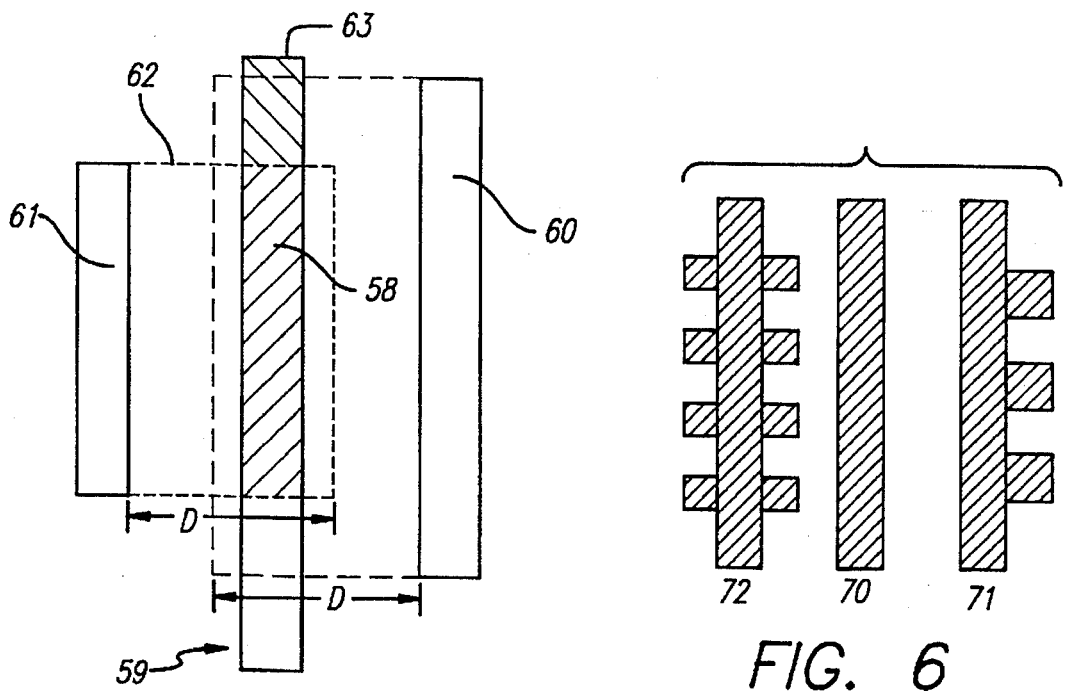
FIG. 5
FIG. 6

METHOD AND STRUCTURE FOR IMPROVING PATTERNING DESIGN FOR PROCESSING

This application is a continuation of U.S. patent application Ser. No. 08/362,839, entitled METHOD AND STRUCTURE FOR IMPROVING PATTERNING DESIGN FOR PROCESSING, filed Dec. 22, 1994 by Prabhakar P. Tripathi, et al., now U.S. Pat. No. 5,477,466, which is a continuation of U.S. patent application Ser. No. 07/732,843, Jul. 19, 1991 now U.S. Pat. No. 5,379,233.

FIELD OF THE INVENTION

This invention relates to interactive feedback to a router, and in particular, to interactive feedback of necessary process physics after completion of physical circuit layout to provide a reliable, manufacturable product.

BACKGROUND OF THE INVENTION

The metallization process in semiconductor technology is well-known in the art. This process begins in the masking area where contacts, i.e. small holes, are etched through all of the surface layers down to the active regions of the chip. Following contact masking, a thin layer of conducting material is deposited by sputtering, CVD techniques, or vacuum evaporation over the entire wafer. The unwanted portions of this layer are removed by patterning, i.e. photomasking and etch procedures. This step leaves the surface covered within thin lines of conductor.

Patterning errors can cause warped or misaligned patterns that result in undesirable electrical characteristics. Hence, the patterning process is critical to ensuring a satisfactory product. Alignment and exposure continue to be at the heart of patterning.

Two important parameters must be considered when photomasking. The first parameter is the aligner's ability to produce a particular size image, i.e. its resolution capability. The second parameter is the aligner's ability to place images in correct relationship to one another, i.e. its registration capability.

During the photomasking process, an optical phenomena, diffraction, occurs which causes printing to vary from one section of the circuit to another. Diffraction is due to the bending effects of a wave of energy as it passes the opaque edge of a mask. Improvement of aligners has been achieved by using shorter wavelengths which lessen the diffraction effect. However, undesirable resolution and registration still occur even with shorter wavelengths.

For example, if a circuit is core limited, i.e., having lots of gates connected with metal lines, then the printing of lines in the circuit remains homogeneous. However, if the circuit has one section which is heavily populated with lines and another section which is less heavily populated with lines (hereinafter called lonely lines), then the width of the lines and the roughness of the edges of the lines vary from one section to another because of this diffraction phenomenon. As circuits become smaller, the undesirability of varying line size dramatically increases. For example, the difference in line size in one micron technology is probably about 0.05 microns which is approximately a 2 percent difference in size. But at one-half micron technology, the approximate size of the effect is still the same, but the difference is now approximately 10 percent, which is unacceptable.

Etching in semiconductor processing may also entail inherent limitations due to a circuit's physical layout. An ideal anisotropic etch leaves vertical walls in the resist and metal layers. However, because the etching chemical dissolves the top of the wall for a longer time than the bottom, the resulting hole is wider at the top than at the bottom. Hence, the etch is isotropic. This etch undesirably undercuts the metal layer beneath the resist which may result in resist lifting or narrow lines. Dry etching processes, such as reactive ion etching, have decreased undercutting, but have not completely solved this problem.

Dry etch techniques rely in part on material from the masking layer (usually photoresist) to achieve anisotropic profiles. This has the undesirable side effect of making the etch anisotropically sensitive to masking pattern density. Hence, lonely lines in an isolated pattern will etch more isotropic than a heavily populated pattern. Both patterns may exist on the same chip design.

Another problem to be addressed, effectively the mirror image of the problem above, is the issue of microloading where the etching rate of the material is dependent upon the amount of material to be etched. Hence, more surface area to be exposed will take a longer period of time to etch. It logically follows that a part of a chip having different and more densely populated area lines will take a shorter time to etch than an area of less density populated lines.

Another factor to consider during patterning is electromigration. Typically, in circuit layout design, lines are designed to be at one predetermined width, irrespective of their future use. This layout design may create electromigration problems, especially in lines which must carry a heavy load. Long, very thin metal lines, typically formed of aluminum, carrying high currents are particularly prone to electromigration. The high current sets up an electric field in the lead and generates heat. As current and frequency increase, the electromigration resistance goes down. During the electromigration, the aluminum in the lead becomes mobile and begins to diffuse to either end of the lead. Under extreme conditions, the lead itself is severed. In the past, a worst case current density was assumed and all metal lines were made wide enough to carry that current. This is undesirable as line widths become smaller and more functions are put on a single chip.

Another phenomena occuring during patterning is inherent stress due to layering. Because various layers of material are printed on the circuit, all of which may have different coefficients of expansion/contraction and degrees of hardness, an intrinsic stress builds up between these layers. This stress may result in the linear expansion of the softer materials, i.e. generally metals, causing metal voiding even with no voltage. Therefore, stress due to layering may also produce an electrical disconnection.

Therefore, a need arises for a method of improving patterning design for processing.

SUMMARY OF THE INVENTION

In accordance with the present invention, dummy lines are placed on the circuit with working lines until a predetermined amount of metallization is present on the circuit. These dummy lines are positioned adjacent lonely lines by at least a predetermined distance.

In one embodiment of the present invention, the metallization amount and placement of dummy lines is implemented with the use of a computer utilizing a computer software program.

DESCRIPTION OF THE DRAWINGS

FIG. 3 illustrates a flow chart of the computerized process steps to be performed in accordance with the present invention to determine placement of dummy lines and ensure availability of carbon molecules for anisotropic etching.

FIG. 5 shows the method of removing redundant local lines performed in pass 2 of the computer program.

FIG. 6 illustrates two forms of dummy lines.

DETAILED DESCRIPTION OF THE DRAWINGS

In accordance with the present invention, dummy lines are printed on the circuit to insure standard sizing of all working lines. The number and positioning of dummy lines is determined by the spacing between lonely lines in both the horizontal and vertical directions. In other words, if the spacing exceeds a predetermined threshold distance in both the horizontal and vertical directions, then dummy lines are inserted. In one embodiment of the present invention, specifically addressing lithographic effects the threshold distances in the horizontal and vertical directions is typically approximately less than 2μ. This threshold value will vary when considering the undercutting problems separately. For example, as the percentage of photoresist on the surface area of the chip increases, the threshold distance increases to greater than 100μ. Clearly, the threshold distance in the horizontal and vertical directions may differ.

Figure 1:
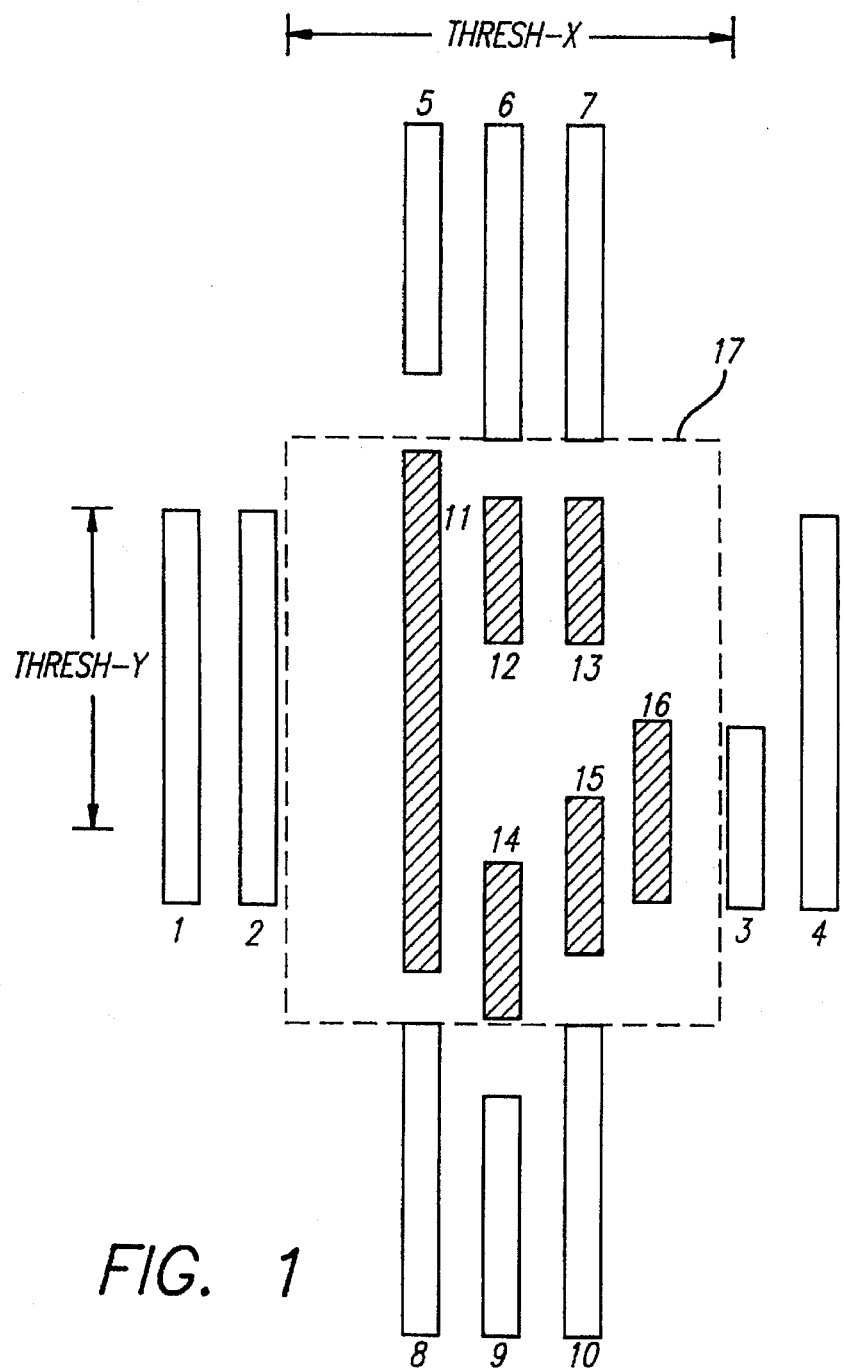
FIG. 1 illustrates dummy lines interposed between working lines to counter lithographic or etching proximity effects.

Referring to FIG. 1, the distance between working line 2 and working line 3 in the horizontal direction exceeds the threshold distance thresh −x, or the distance between working lines 5–7 and lines 8–10 in the vertical direction exceeds the threshold distance thresh −y. Therefore, dummy lines 11–16 are printed in the area defined by the dashed box 17 to ensure uniform printing of all working lines.

These dummy lines are left floating, i.e. not connected to the working lines in the circuit, to avoid possible shorting. The size of dummy lines 11–16 typically remains constant. Hence, a larger defined area between working lines requires the insertion of more dummy lines.

To facilitate easy identification, the dummy lines may be formed differently than working line. FIG. 6 shows two possible methods. In FIG. 6, working line 70 is bonded by two dummy lines 71 and 72. Dummy line 71 is typically used for countering lithographic effects while line 72 is generally implemented to solve undercutting problems. Solving for lithographic effects involve very small tolerances in distances, therefore having one smooth side in line 71 is important to solving this problem. Although dummy lines may have many forms, forming the dummy lines into a closed loop may produce an undesirable antenna effect.

Interactive feedback which measures the amount of photoresist on the metal layer significantly reduces the problem of undercutting while etching. Photoresist comprises, among other ingredients, a light-sensitive, i.e. energy-sensitive, polymer. A polymer is a heavy molecule containing carbon, hydrogen, and oxygen formed into a particular repetitive pattern. When multiple lines are etched adjacent one another, i.e. within the threshold distance mentioned previously, the process provides carbon molecules from the polymer which form a coating on the sidewall to prevent undercutting. Hence, the etching will be substantially anisotropic.

However, when the line to be etched is not adjacent to another, no carbon is available to form the necessary coating. Therefore the etch becomes ragged, i.e. more isotropic, which may result in circuit breakdown due to undercutting.

In accordance with the present invention and current processing techniques, at least approximately 17 percent of the chip must be covered with photoresist in order to provide sufficient amounts of carbon to form the coating which subsequently insures an anisotropic etch. Note the amount of resist is, in effect, the amount of metallization on the chip. If the amount of photoresist (or metallization) is at 17 percent, then placement of dummy lines is unnecessary regardless of less populated areas. Therefore, the determination of photoresist coverage precedes the printing of dummy lines.

To solvent the electromigration problem, the current each line will carry is determined from the electrical design before processing. In accordance with the present invention, line width will vary depending upon the kind of duty cycle and current density that will be one each line. In one embodiment, lines carrying larger currents would be widened to greater than 2μ while lines carrying less current could be narrower. A second or complimentary method could be to route a parallel line(s) for high current paths, reducing the current density carried by any one metal clue.

Figure 2:
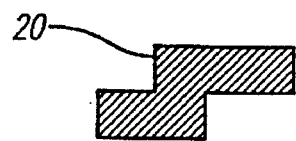
FIG. 2 shows one example of a stress relief point on a metal line.

Because stress due to layering is a function of the amount of metal and the ability of a harder material i.e. a dielectric, to exert a force over that metal, the user enhances the probability of electrical disconnection by running a very lone line along the chip. In accordance with the present invention, a metal line is provided with stress relief points. In one embodiment, the stress relief point is a 90-degree jog on line 20 as seen in FIG. 2. A 90-degree jog is used because it is easy to digitize. A 45 or 60-degree angle, although also solving the layering stress problem would require a smaller resolution and therefore take longer to digitize the output. Stress relief may also be accomplished by vertically jogging from one metal layer to another through a via.

In one embodiment, the above-mentioned considerations are implemented in a router system using a computer programmed with the software found in Appendix A. The computer softwater found in Appendix A specifically addresses the undercutting problem mentioned above. Clearly, the invention may also be implemented by user manipulation of the router software to direct the router to include dummy lines where appropriate. This software program is written in C Language and is usable at any work station with a Modular Development Environment Layout Development System (MDE-LDS), release 10, which is commercially available from LSI Logic Corporation, located in Milpitas, Calif. The definition of the options (and default values) used in the software program, and various portions of the Specification hereinafter, is set forth below in Table 1.

TABLE I

| | |
|---|---|
| <none> | calculate metal utilization and give suggestions for whether lonely wires exist. |
| -help | list available options |
| -insert_wire | inserting wires, none for suggestion |
| -loop | loop until reach required metal utilization |
| -fm_only | processing first metal only |
| -sm_only | processing second metal only |
| -tm_only | processing third metal only |
| -lower_percent | lowest required metal utilization, OB (default 17%) |
| -upper_percent | metal utilization to be added to, OB (default 20%) |
| -thresh_x # | threshold for lonely wire in X direction (default: 100u), OB |

TABLE I-continued

| | |
|---|---|
| -thresh_y # | threshold for lonely wire in Y direction (default: 100u), OB |
| -mesh_x # | distance between mesh in X direction (default: wire width of protecting wires), OB |
| -mesh_y # | distance between mesh in Y direction (default: wire width of protecting wires), OB |
| -bloat1_x # | min distance between wire and protecting wires in X direction (default: 15u), OB |
| -bloat1_y # | min distance between wire and protecting wires in Y direction (default: 15u), OB |
| -bloat2_x # | width for protecting wires in X direction (default: 75u), OB |
| -bloat2_y # | width for protecting wires in Y direction (default: 75u), OB |
| -area_xa # | outline for checking area, OB |
| -area_ya # | outline for checking area, OB |
| -area_xb # | outline for checking area, OB |
| -area_yb # | outline for checking area (default: center region), OB |
| -wire_type # | type for protecting wire, 1 for 1G wire, 2 for 2G wire (default:2), OB |
| -filled | make filled protections, OB |
| -line | make protections in straight lines, OB |
| -allow_redundancy | allow redundant protections, OB |
| -debug | add more debug information to standard output, OB |

In the above table, OB stands for obscured options, and # stands for number of microns multiply 1000 if not specified. For example, if #=200000≧200μ.

FIG. 3 illustrates a flow chart of the process steps performed by the computer to determine placement of dummy lines and to ensure availability of carbon molecules for anisotropic etching. To achieve the goal of having a predetermined amount of photoresist on wafer during etching, it may be necessary to traverse the flow chart loop several times. In the first pass through the loop, the metal utilization being analyzed is based on the metallization used in implementing the electrical circuit. As will be explained more fully below, the metallization area being measured in the first step of subsequent passes includes dummy lines added during the preceding pass(es).

In step 40, the computer determines the metal utilization on the chip. The metal utilization is functionally equivalent to the area of photoresist on the surface of the chip. After this determination is made, the computer proceeds to step 41.

Step 41 questions whether the metal utilization is lower than the minimal requirement. In one embodiment of the present invention, the software specifies this minimal requirement as being at least approximately 17 percent of the surface area of the chip.

Figure 4:
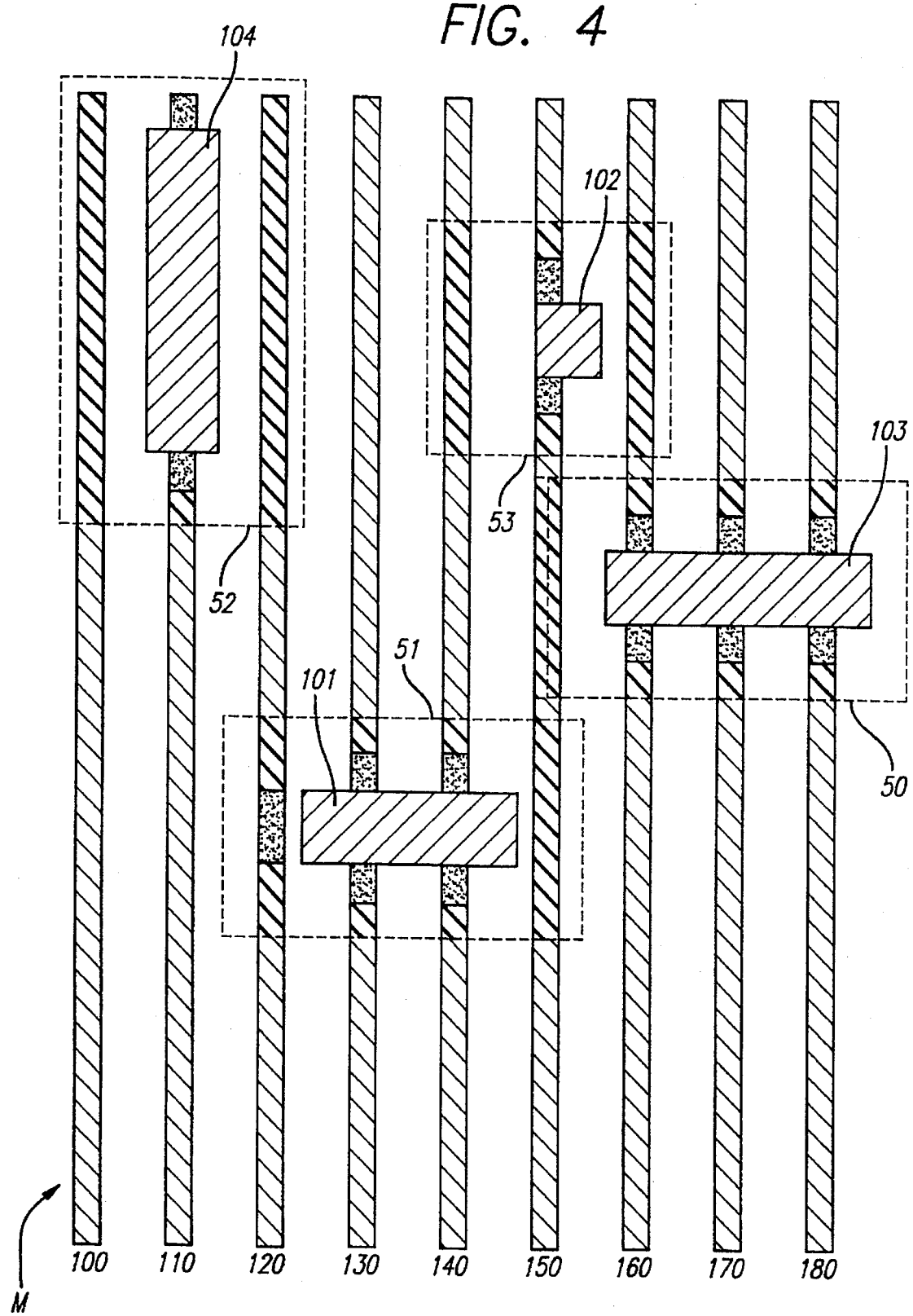
FIG. 4 shows one example of placement of dummy lines after partial removal of a local line mesh.

If the metal utilization is lower than the minimal requirement, the computer proceeds to step 42 which is initializing the mesh. In step 42, initialization includes creating a mesh of dummy lines, also called local wires, in a particular pattern. Referring to FIG. 4, the mesh M in this embodiment is comprised of local wires 100–180, which run parallel to each other. Typically, although not shown in this embodiment, the local wires are positioned in the predominant direction of the working lines, also called physical wires, used for the layer of metallization being examined. Mesh M is superimposed over the already laid out physical wires which are identified in FIG. 4 by reference characters 101, 102, 103 and 104. In one embodiment, local wires 100–180 have a width of approximately 8μ with a distance between adjacent edges of the local wires being approximately 8–9μ. As will be appreciated from FIG. 4, that drawing, as well as other drawings are not necessarily to scale.

In pass 1 which is found in step 43, all overlap between the physical wires and the local wires is removed. This ensures that no shorting will occur between the local wires and physical wires. At this time, the distance between a local wire and physical wire is made to be at least "bloat 1", i.e. a minimum distance between the physical wire and local wire. In one embodiment, "bloat 1" is approximately 15μ. For example, as illustrated in dashed line block 50, the blackened portions at local lines 160–180 will be eliminated from the mesh. Furthermore, local wire segments are removed if their length becomes less than the predetermined threshold distance which in one embodiment is 100μ.

During pass 2 found in step 44, local wires are removed if they are found to be "redundant." removing redundancy is accomplished as follows: local wires are marked from left and right of physical wires if their distance is less a predetermined distance D. Distance D is generally defined as the threshold distance minus ("bloat 1", the minimum distance between the physical and local wire, plus the width of the local wire.) Distance D is roughly slightly larger than the threshold distance divided by two. For example, if a segment 58 of local wire 59, as shown in FIG. 5, is marked from both the left and the right of physical wires 60 and 61 by a distance D, respectively, then segment 58 of local wire 59 is removed. Once again, if the remaining local wire segment is less than the threshold value, it is also removed. As illustrated in FIG. 5, portion 63 which extends above dashed line 62 is less than the threshold value, and will be removed.

During pass 3 found in step 45, portions of local lines inside a predetermined periphery of the physical wires are marked and will be maintained, while portions not marked will be removed. For example, as seen in FIG. 4, dummy lines, or portions thereof, outside a predetermined periphery (indicated by dashed lines boxes 50–53) of each physical line (100–103) are removed to minimize the amount of dummy line metallization added to the chip. If the boundary contacts a local line, as box 50 does with line 150, the local line is not removed. Thus, the cross-hatched portions of the mesh of dummy lines 10–18 are removed. The dummy lines to remain are indicated by the double-thick hatching.

During the final step 46, all remaining portions of local lines are generated in a distinguishable pattern to facilitate identification of these local line portions. After step 46 is completed, the computer returns to the initial step 40 for determining metal utilization which is now the sum of the physical wires and remaining portions of the local lines. If the metal utilization is found to still be lower than the minimal requirement, then the computer repeats steps 42–46 until the metal utilization is not lower than the minimal requirement. Before repeating steps 42–46 on the second traverse through these steps, the local line portions which were created during the first traverse of steps 42–46 are treated as physical wires and the creation of the mesh for the second traverse is conducted in the same manner as previously done. Local lines created in the second and any subsequent loops are similarly treated. When this requirement is met, the computer ends the program at step 47, and the resulting layout is then ready for fabrication.

The preceding description is meant to be illustrative only and not limiting. The above describes the metal etch undercutting problem. For lithographic, electromigration, and layering stress problems the methods would be similar but not identical. Those skilled in the art will be able to apply other methods in accordance with this invention based on the appended claims.

Appendix A

"mu.h"

```
#ifndef mu
#define mu
endif ifndef lint
static char muhhdr[] = "$Header$";
#endif

/* header file for lonely wire */ include <stdio.h>
include <ctype.h>
#include <time.h>
#include "ss.h"
#include "ma.h"

#define INFINITY 2147483647 /* 2**31 - 1 */
#define BSIZE 512
#define MIN_THRESH_X 10000
#define MIN_THRESH_Y 10000
#define LEFT_BOT 1
#define RIGHT_TOP 2
define BOTH 3 define NOT_MARKED 0
define ONE_ENDS 1
define BOTH_ENDS 2 typedef struct _elementlist
{
   short type;
   union
   {
      WIRE*pw;
      VIA*pv;
      BLOCK*pb;
      PIN*pp;
   } e;
   struct _elementlist *pnext;
} ELEMENTLIST;

typedef struct _wirelist
{
  int    start, end;           /* outline of pseudo wires */
  short  lb_mark, rt_mark;     /* left bottom mark, right top mark */
  struct _wirelist *pnext;     /* next in list */
} WIRELIST;

typedef struct _meshlist
{
```

Appendix A

```
        int         no_of_wires;
        WIRELIST    *wirelist;
    } MESHLIST;

MUEXTERN int            no_of_groups;
    MUEXTERN int            no_of_elements;
    MUEXTERN MESHLIST       *meshes;
    MUEXTERN ELEMENTLIST    *elements;

MUEXTERN char*design_name, *cdate();
    MUEXTERN char design_buff[BSIZE], buff[BSIZE], msg[BSIZE];

/* Global control varialbes */

MUEXTERN int        size_of_mem;
    MUEXTERN int        area_xa, area_ya, area_xb, area_yb;
    MUEXTERN int        thresh_x, thresh_y;
    MUEXTERN int        mesh_x, mesh_y;
    MUEXTERN int        bloat1_x, bloat1_y;
    MUEXTERN int        bloat2_x, bloat2_y;
    MUEXTERN int        wire_type;
    MUEXTERN int        pattern;
    MUEXTERN int        wire_width;
    MUEXTERN int        ref, mesh, thresh;

MUEXTERN int x_y; /* 1 for horizontal mesh, 2 for vertical mesh */

/* Flags */

MUEXTERN int        insert_wire;
    MUEXTERN int        remove_wire;
    MUEXTERN int        fm_only;
    MUEXTERN int        sm_only;
    MUEXTERN int        tm_only;
    MUEXTERN int        allow_redundancy;
    MUEXTERN int        line;
    MUEXTERN int        filled;
    MUEXTERN int        loop;
    MUEXTERN float      upper_percent;
    MUEXTERN float      lower_percent;
    MUEXTERN int        debug;
    MUEXTERN int        helpflg;
    MUEXTERN int        RET_flag;
    MUEXTERN int        views_modified;

/* defined for ev package */ define SUCCESS_RET    0
    #define WARNING_RET    4
    #define ERROR_RET      8
    #define FATAL_RET      12
```

Appendix A

```
#define ABORT_RET    12
#define HELP_RET     16
#define MGSIZE       4000
```

17
Appendix A

"mu.c"

/*******************************************************************

```c
#define MUEXTERN
#include <sys/types.h>
#include <sys/stat.h>
#include "mu.h"
#include "ssdef.h"
#include "lsiape.h"
#include "mt.h"

static char     *in_file;
static char     in_buf[BSIZE];
static int      views_modified;
static float    version;

static APE_ARG_REC atf_table[]=
{
 APE_ARG_VAL("thresh_x","%d",thresh_x,"Dist for lonely wire in X"),
 APE_ARG_VAL("thresh_y","%d",thresh_y,"Dist for lonely wire in Y"),
 APE_ARG_VAL("mesh_x","%d",mesh_x,"Dist between Mesh in X" ),
 APE_ARG_VAL("mesh_y","%d",mesh_y,"Dist between Mesh in Y" ),
 APE_ARG_VAL("bloat1_x","%d",bloat1_x,"Bloat between mesh and wire in X" ),
 APE_ARG_VAL("bloat1_y","%d",bloat1_y,"Bloat between mesh and wire in Y" ),
 APE_ARG_VAL("bloat2_x","%d",bloat2_x,"Bloat for second pass in X" ),
 APE_ARG_VAL("bloat2_y","%d",bloat2_y,"Bloat for second pass in Y" ),
 APE_ARG_VAL("area_xa","%d",area_xa,"Area for examining MU" ),
 APE_ARG_VAL("area_ya","%d",area_ya,"Area for examining MU" ),
 APE_ARG_VAL("area_xb","%d",area_xb,"Area for examining MU" ),
 APE_ARG_VAL("area_yb","%d",area_yb,"Area for examining MU" ),
 APE_ARG_VAL("wire_type","%d",wire_type,"Wire type choosen for protection" ),
 APE_ARG_VAL("pattern","%d",pattern,"Protection pattern" ),
 APE_ARG_VAL("lower_percent","%f",lower_percent,"Required percentage" ),
 APE_ARG_VAL("upper_percent","%f",upper_percent,"Required percentage" ),
 APE_ARG_BOOL("insert_wire",insert_wire,"Insert wire" ),
 APE_ARG_BOOL("line",line,"Make line protection" ),
 APE_ARG_BOOL("loop",loop,"Loop until requirement met" ),
 APE_ARG_BOOL("filled",filled,"Hollow or filled protections" ),
 APE_ARG_BOOL("allow_redundancy",allow_redundancy,"allow redundant protections" ),
 APE_ARG_BOOL("fm_only", fm_only, "fm" ),
 APE_ARG_BOOL("sm_only", sm_only, "sm" ),
 APE_ARG_BOOL("tm_only", tm_only, "tm" ), APE_ARG_BOOL("h", helpflg, "help flag"),
```

Appendix A

```
  APE_ARG_RAW(in_file, TRUE, "name of input file"),
  APE_LAST(),
};

LIBRARY *indmp, *outdmp;

/******************************************************************/ main ( argc, argv )
int argc;
char *argv[];
{ version = 11.002;
 in_file = NULL;

if (( sysout = fopen( "MU.SYSOUT", "w" )) == NULL )
 {
   printf( "Unable to open sysout file.\n" );
   exit( FATAL_RET );
 } msgout(
"=================================================================\n"
);

sprintf( msg, "\n\t%2.3f\t%s\n\t%s\n\n", msgout( msg );

MU_argparse( argc, argv );

if ( helpflg ) MU_help();

MU_argcheck();

RET_flag = SUCCESS_RET;

mt_init( argc, argv, "MU" );

msgout( "Restoring dump file . . .\n" );

if ( ll_restore( in_file, &indmp ) != 0 )
   MU_wipeout( "unable to restore dump file" );

views_modified = FALSE;

MU_main();
```

Appendix A

```
}

/************************************************************
 * MU argument parsing routine
 ************************************************************/

MU_argparse( argc, argv )
int argc;
char *argv[];
{
FILE *test_file;
char test_name[BSIZE];

thresh_x = 100000; /* approx. 100u or 25 gird */
  thresh_y = 100000; /* approx. 100u or 25 grid */
  mesh_x = 0;
  mesh_y = 0 ;
  bloat1_x = 15000;
  bloat1_y = 15000;
  bloat2_x = 75000;
  bloat2_y = 75000;

area_ya = 0;
  area_ya = 0;
  area_xb = 0;
  area_yb = 0;
  wire_type = 2;
  pattern = 1;

lower_percent= 17.0;
  upper_percent= 20.0;

fm_only = FALSE;
  sm_only = FALSE;
  tm_only = FALSE;
  insert_wire = FALSE;
  line = FALSE;
  filled = FALSE;
  allow_redundancy = FALSE;
  helpflg = FALSE;

ape_parse(argc, argv, atf_table, ape_layout_error);

if ( helpflg ) MU_help();

if ( in_file == NULL && !helpflg )
  {
  *in_buf = NULL;
  while ( *in_buf == NULL )
  {
  printf( "Enter DMP file name:\n" );
  scanf( "%s", in_buf );
```

20
Appendix A

```c
}
in_file = in_buf;
} mu_lcuc( in_file ); /* convert to upper */ strcpy( test_name, in_file );
strcat( test_name, ".DMP" );

if (( test_file = fopen( test_name, "r" )) == NULL )
{
  msgout( "Input file does not exist.\n" );
  MU_exit( RET_flag = FATAL_RET );
}
else
   fclose( test_file );
}

/***********************************************************
 * MU argument checking routine
 ***********************************************************/
MU_argcheck()
{ if ( thresh_x < MIN_THRESH_X || thresh_y < MIN_THRESH_Y )
MU_wipeout( "The threshold value is too small" );

if ( bloat1_x <= 200 || bloat1_y <= 200 )
MU_wipeout( "The first bloat should be at least 0.2u(200)" );

if ( bloat2_x <= 200 || bloat2_y <= 200 )
MU_wipeout( "The second bloat should be at least 0.2u(200)" );

if ( area_xa > area_xb || area_ya > area_yb )
MU_wipeout( "Incorrect outline used" );

if ( wire_type != 1 && wire_type != 2 && wire_type != 3 )
MU_wipeout( "Unknown wire type" );

if ( pattern != 1 && pattern != 2 && pattern != 0 )
MU_wipeout( "Unknown pattern" );
}

/***********************************************************
 * message output routine
 ***********************************************************/
msgout(message)
char *message;
{
 int  i, j = strlen( message );
```

Appendix A

```c
  for ( i = 0; i < j; i++ ) putchar( message[i] );
  if ( sysout != NULL ) fprintf( sysout, "%s\n", message );
}

/*****************************************************************
 * MU Help
 *****************************************************************/

MU_help()
{ msgout( "Help information:\n\n" );
msgout( "This program places wires for protecting lonely wire in different\n" );
msgout( "layers for any kind for designs.\n" );
msgout( "Valid Command Line Options:\n\n" );
msgout( "argument purpose\n" );
msgout( "-------------------------------------------------------------------\n" );
msgout( "-h this message.\n" );
msgout( "-thresh_x # threshold for lonely wire in X direction\n" );
msgout( "-thresh_y # threshold for lonely wire in Y direction\n" );
msgout( "-mesh_x # distance between mesh in X direction\n" );
msgout( "-mesh_y # distance between mesh in Y direction\n" );
msgout( "-bloat1_x # min distance between wire and protection in X\n" );
msgout( "-bloat1_y # min distance between wire and protection in Y\n" );
msgout( "-bloat2_x # bloat for ring in X\n" );
msgout( "-bloat2_y # bloat for ring in Y\n" );
msgout( "-area_xa # outline for checking area\n" );
msgout( "-area_ya # outline for checking area\n" );
msgout( "-area_xb # outline for checking area\n" );
msgout( "-area_yb # outline for checking area\n" );
msgout( "-wire_type # 1 for regular wire, 2 for 2g, 3 for 3g wire\n" );
msgout( "-pattern # 0, 1, 2 are available, 2 is default\n" );
msgout( "-insert_wire inserting wires, none for suggestion\n" );
msgout( "-line make protection in line\n" );
msgout( "-filled make filled protections\n" );
msgout( "-allow_redundancy allow redundant protections\n" );
msgout( "-fm_only process fm only\n" );
msgout( "-sm_only process sm only\n" );
msgout( "-tm_only process tm only\n" );
msgout( "-debug add more debug information to standard output.\n\n" );
msgout( "<fn> stands for file name.\n" );
msgout( "# stands for no of microns multiply 1000 if not specified.\n" );
msgout( "e.g. 1u = 1000\n" );
msgout( "-------------------------------------------------------------------\n" );
RET_flag = HELP_RET;
MU_exit( HELP_RET );

}

/***********************************************************
```

Appendix A

```c
 * Fatal Error Encountered, terminate program.
 ***********************************************************/
MU_wipeout( message )
char *message;
{
 char str[BSIZE];

sprintf( str, "MU input file logic error: %s\n Program stopped\n", message );
 msgout( str );

RET_flag = FATAL_RET;
 MU_exit( FATAL_RET );
}

/***********************************************************
 * Print out warning message and set warning flag
 ***********************************************************/
MU_warning( message )
char *message;
{
 char str[BSIZE];

sprintf( str, "MU Warning: %s\n", message);
 msgout( str );

RET_flag = WARNING_RET;
}

/***********************************************************
 * MU exit routine
 ***********************************************************/
MU_exit( code )
int code;
{ char dump_name[ BSIZE ];
int i;

if ( indmp != NULL )
if ( lclose( indmp ) != 0 && RET_flag != FATAL_RET )
  msgout( "error while closing input file" );

if ( views_modified )
  msgout( "Data has been modified.\n" );
else if ( RET_flag != HELP_RET )
  msgout( "Data has not been changed, no dump file is necessary\n" );

if ( RET_flag == SUCCESS_RET )
{
  for ( i = 0; i < 4 && in_file[ i ] != '\0'; i++ )
  dump_name[ i ] = in_file[ i ];
```

Appendix A

```
    dump_name[ i ] = '\0';

strcat ( dump_name, "MU.DMP");
    unlink ( dump_name );

if (( outdmp = lopen( dump_name, "w")) == NULL )
    {
        msgout( "Unable to open output dump file\n" );
        exit( FATAL_RET );
    }
    msgout( "dumping file. . .\n" );

gen_action( "MU", version );

if ( ll_dump( outdmp ) != 0 )
    {
        msgout( "Error while dumping output file" );
        exit( FATAL_RET );
    }
    /* close libraries */
    if ( lclose( outdmp ) != 0 )
    {
        msgout( "Error while closing library" );
        exit( FATAL_RET );
    } sysout = fopen("MU.SYSOUT", "a");
    msgout( "Dump complete . . .\n" );
    sprintf( msg, "return code = %d\n", RET_flag );
    msgout( msg );

fclose (sysout);
    mt_exit( "SUCCEED" );

} sprintf( msg, "return code = %d\n", RET_flag );
msgout( msg );

fclose (sysout);
mt_exit( "SUCCEDD" );
}

/****************************************************************
 * Subroutine for transfering string from lower to upper case
 ****************************************************************/
mu_lcuc( str )
char *str;
{
int i;
for ( i=0; str[i]; i++ )
```

Appendix A

```
if ( str[i] >= 'a' && str[i] <= 'z' ) str[i] += 'A' - 'a';
}
```

25
Appendix A

"mumain.c"

```c
#ifndef lint
static char mumain_c[] = "$Header$";
#endif

/******************************************************************* define MUEXTERN extern
include "mu.h"

/***********************************************************
 * MU main processing routine
 ***********************************************************/ void MU_main()
{
    int      err;
    double   cur_percentage;
    double   pre_percentage;
    double   MU_test_requirement();
    LAYER    *pl;
    REGION   *prcenter, *cv_find_reg();

if ( area_xa + area_ya + area_xb + area_yb == 0 )
    {
        name_region( "CENTER", &prcenter );
        area_xa = prcenter->oxa;
        area_ya = prcenter->oya;
        area_xb = prcenter->oxb;
        area_yb = prcenter->oyb;
    }

RET_flag = SUCCESS_RET;

/* forall_layers */
    for ( pl = layhead; pl; pl = pl->pl )
    {

/* process single layers only */
        if ( pl->type == MULTI ) continue;
```

26
Appendix A

```
if ( fm_only && strcmp( pl->name, "FM" ) != 0 ) continue;
if ( sm_only && strcmp( pl->name, "SM" ) != 0 ) continue;
if ( tm_only && strcmp( pl->name, "TM" ) != 0 ) continue;

/* do not process if not available for routing */
if ( !pl->available ) continue;

sprintf( msg, "\nProcessing layer ===> %s\n", pl->name );
msgout( msg );

pre_percentage = 0.0;
cur_percentage = MU_test_requirement( pl );

if ( insert_wire )
{
 if ( loop )
 { if ( cur_percentage < lower_percent )
   while ( cur_percentage < upper_percent
   && pre_percentage < cur_percentage )
   {
      MU_place_protections( pl );
      pre_percentage = cur_percentage;
      cur_percentage = MU_test_requirement( pl );
   }
 }
 else /* no options */

MU_place_protections( pl );
 }

}

MU_exit( RET_flag ); /* normal exit program */

}

/*************************************************************
* Subroutine for inserting wires for all layers
*************************************************************/

MU_place_protections( pl )
LAYER *pl;
{
 int  i, err;

/**********************************************/
 msgout( "Initializing local wires. . .\n" );
 MU_init_local_wires( pl );
```

Appendix A

```
/******************************************************/
msgout( "Finding spaces. . .\n" );

MU_find_spaces( pl );

/******************************************************/
if ( !allow_redundancy )
{
 msgout( "Remove redundancy. . .\n" );
 MU_find_boundary_elements( pl );
 MU_remove_redundancy( pl );
}
/******************************************************/
if ( !filled )
{
 msgout( "Marking wires. . .\n" );
 MU_making_rings( pl );
}

/******************************************************/
msgout( "Inserting wires. . .\n" );
MU_insert_wires( pl );

msgout( "Free Local wires. . .\n" );
MU_free_local_wires();

}

/****************************************************************************
 * Subroutine for initializing all local wires and global var
 ****************************************************************************/
MU_init_local_wires( pl )
LAYER *pl;
{ int i, wire_start, wire_end;

switch( wire_type )
 {
 case 1:
   wire_width = pl->pwtype->width / 2;
   break;

case 2:
   wire_width = pl->pwtype->pwtype->width / 2;
   break;

case 3:
   wire_width = pl->pwtype->pwtype->pwtype->width / 2;
   break;
```

28
Appendix A

```
}

/* find no. of groups needed and initial global variables */ switch( pl->dirt )
{
case X:

if ( mesh_y > ( thresh_y/2 ) || mesh_y == 0 )
  {
   mesh_y = wire_width * 6;
   msgout( "Default value for mesh in Y direction is used\n" );
  }
  x_y =    X;
  ref =    area_ya;
  mesh =   mesh_y;
  thresh = thresh_x - bloatl_x * 2;
  no_of_groups =    ( area_yb - area_ya ) / mesh_y;
  if ( no_of_groups *  mesh_y == area_yb - area_ya )
  no_of_groups++;
  wire_start =area_xa;
  wire_end =area_xb;
  break;

case Y:

if ( mesh_x > ( thresh_x/2 ) || mesh_x == 0 )
  {
   mesh_x = wire_width * 6;
   msgout( "Default value for mesh in X direction is used\n" );
  }
  x_y =    Y;
  ref =    area_xa;
  mesh =   mesh_x;
  thresh = thresh_y - bloatl_y * 2;
  no_of_groups = ( area_xb - area_xa ) / mesh_x;
  if ( no_of_groups * mesh_x == area_xb - area_xa )
  no_of_groups++;
  wire_start =area_ya;
  wire_end =area_yb;
  break;

default:

MU_wipeout( "Unknow direction for layer" );
}

/* allocate meshes */
/*******************************************************************/
```

Appendix A

```
meshes =
( MESHLIST * )ma_alloc( sizeof( MESHLIST ) * no_of_groups );

/* allocate memory for each group */
/******************************************************************/ for ( i = 0; i < no_of_groups; i++ )
{
  meshes[i].no_of_wires = 1;
  meshes[i].wirelist =
  (WIRELIST *)ma_alloc( sizeof( WIRELIST ) );

(meshes[i].wirelist)->start = wire_start;
  (meshes[i].wirelist)->end = wire_end;
  (meshes[i].wirelist)->lb_mark = FALSE;
  (meshes[i].wirelist)->rt_mark = FALSE;
  (meshes[i].wirelist)->pnext = (WIRELIST *) NULL;
}

/* initialize overlaped element list */
/******************************************************************/ no_of_elements = 0;
elements = (ELEMENTLIST *)NULL;

}

/*******************************************************************
 * Subroutine for freeing all local wires
 *******************************************************************/
MU_free_local_wires()
{
 int i;
 WIRELIST     *pw, *pw_next;
 ELEMENTLIST  *pe, *pe_next;

for ( i = 0; i < no_of_groups; i++ )
 {
   for ( pw = meshes[i].wirelist; pw; pw = pw_next )
   {
     pw_next = pw->pnext;
     ma_free( pw );
   }

} ma_free( meshes );
 no_of_groups = 0;
 meshes = (MESHLIST *)NULL;
```

Appendix A

```
for ( pe = elements; pe; pe = pe_next )
{
  pe_next = pe->pnext;
  ma_free( pe );
} no_of_elements = 0;
elements = (ELEMENTLIST *)NULL;

}
```

Appendix A

"mupass1.c"

```c
#ifndef lint
static char mupass1_c[] = "$Header$";
#endif

/************************************************************************** define MUEXTERN extern
include "mu.h"

/**************************************************************************/

MU_find_spaces( pl )
LAYER *pl;
{ int  i, oxa, oya, oxb, oyb;
  int  layer_code = pl->code;
  NET  *pn;
  RGNNET *prnnet;
  WIRE *pw;
  VIA  *pv;
  PIN  *pi;
  BLOCK *pb;
  REGION *pr;
  void mu_get_wire_outline(),
    mu_get_via_outline(),
    mu_get_pin_outline(),
    mu_get_block_outline(),
    mu_remove_overlaps();

/* forall_nets */ for ( pn = nethead; pn; pn = pn->pn )
  { for ( prnnet = pn->prnnet; prnnet; prnnet = prnnet->prnnet )
    {

/* Check all wires */
      /**************************************************************/ for ( pw = prnnet->pw; pw; pw = pw->pw )
```

Appendix A

```
    {
      if (( layer_code & pw->pwtype->code ) == 0 ) continue;

/* consider same layer wires only */ mu_get_wire_outline
        ( pw, &oxa, &oya, &oxb, &oyb, bloatl_x, bloatl_y );
      mu_remove_overlaps( oxa, oya, oxb, oyb );
    }

/* Check all Vias */
    /*******************************************************/ for ( pv = prnnet->pv; pv; pv = pv->pv )
    {
      if (( layer_code & pv->pvtype->code ) == 0 ) continue;

/* consider same layer vias only */ mu_get_via_outline
        ( pv, &oxa, &oya, &oxb, &oyb, bloatl_x, bloatl_y );
      mu_remove_overlaps( oxa, oya, oxb, oyb );
    }

/* Check all pins */
    /*******************************************************/ for ( pi = prnnet->pi; pi; pi = pi->pi )
    {
      if (( layer_code & pi->pitype->code ) == 0 ) continue;

/* consider same layer pins only */
      mu_get_pin_outline
        ( pi, &oxa, &oya, &oxb, &oyb, bloatl_x, bloatl_y );
      mu_remove_overlaps( oxa, oya, oxb, oyb );
    }

}
} for ( pb = chip.pcb; pb; pb = pb->pb )
{
  /* Check all chip blocks */
  /*******************************************************/ if (( layer_code & pb->code ) == 0 ) continue;

/* consider same layer blocks only */
  mu_get_block_outline
    ( pb, &oxa, &oya, &oxb, &oyb, bloatl_x, bloatl_y );
  mu_remove_overlaps( oxa, oya, oxb, oyb );
}
```

33

Appendix A

```
for ( pr = chip.pr; pr; pr = pr->prrgn )
for ( pb = pr->prb; pb; pb = pb->pb )
{
  /* Check all cell blocks */
  /*****************************************************/ if (( layer_code & pb->code ) == 0 ) continue;

/* consider same layer blocks only */
  mu_get_block_outline
  ( pb, &oxa, &oya, &oxb, &oyb, bloatl_x, bloatl_y );
  mu_remove_overlaps( oxa, oya, oxb, oyb );
 }

}

/*****************************************************/ void mu_remove_overlaps( oxa, oya, oxb, oyb )
intoxa, oya, oxb, oyb;
{ int    group_start, group_end;
  int    outline_a, outline_b;
  int    wire_start, wire_end;
  int    new_wire_start, new_wire_end;
  int    i, del, exit_loop;
  int    modified = FALSE;
  WIRELIST *new_wire, *mu_add_segment();
  WIRELIST **pw;

/*****************************************************/ switch( x_y )
{
case X:

outline_a =   oya;
  outline_b =   oyb;
  wire_start =  oxa;
  wire_end =    oxb;
  break;

case Y:

outline_a =   oxa;
  outline_b =   oxb;
  wire_start =  oya;
  wire_end =    oyb;
```

Appendix A

```
  break;
} hash_groups
( &group_start, &group_end, outline_a, outline_b );

/* for all overlaped groups */
/******************************************************/
for ( i = group_start; i <= group_end; i++ )
{
  exit_loop = FALSE;
  for ( pw = &(meshes[i].wirelist); *pw && !exit_loop; )
  { del = FALSE;

/* no overlap */
    /******************************************************/
    if ( wire_start >= (*pw)->end || wire_end <= (*pw)->start )
    { /* do nothing */ }

/* partially covered at lower end */
    /******************************************************/
    else if ( wire_start > (*pw)->start && wire_end >= (*pw)->end )
    {
      (*pw)->end = wire_start;
      del = mu_check_segment( pw, i );
    }

/* partially covered at higher end */
    /******************************************************/
    else if ( wire_end < (*pw)->end && wire_start <= (*pw)->start )
    {
      (*pw)->start = wire_end;
      del = mu_check_segment( pw, i );
    }

/* crossed by wire */
    /******************************************************/
    else if ( wire_end < (*pw)->end && wire_start > (*pw)->start )
    {
      new_wire_start = wire_end;
      new_wire_end = (*pw)->end;
```

Appendix A

```c
    if ( new_wire_end - new_wire_start >= thresh )
    {
     new_wire =
     mu_add_segment( i, new_wire_start, new_wire_end );

if ( pw == &(meshes[i].wirelist))
     pw = &(new_wire->pnext);
    }

(*pw)->end = wire_start;
    del = mu_check_segment( pw, i );
    exit_loop = TRUE;
   }

/* fully covered */
   /****************************************************/
   else if ( wire_start <= (*pw)->start && wire_end >= (*pw)->start )
   { /* delete this segment */
    mu_del_segment( pw, i );
    del = TRUE;
   } if ( !del ) pw = &((*pw)->pnext);
  }
 }
}
```

Appendix A

"mupass2.c"

```c
#ifndef lint
static char mupass2_c[] = "$Header$";
#endif

/******************************************************************/ define MUEXTERN extern
include "mu.h"

/******************************************************************/
MU_find_boundary_elements( pl )
LAYER *pl;
{ int      i, oxa, oya, oxb, oyb;
    int      layer_code = pl->code;
    int      bloat_x = thresh_x;
    int      bloat_y = thresh_y;
    NET      *pn;
    WIRE     *pw;
    VIA      *pv;
    PIN      *pp;
    BLOCK    *pb;
    RGNNET   *prnnet;
    REGION   *pr;
    ELEMENTLIST *pe;
    void     mu_get_wire_outline(),
             mu_get_via_outline(),
             mu_get_pin_outline(),
             mu_get_block_outline();

/* forall_nets */ for ( pn = nethead; pn; pn = pn->pn )
{ for ( prnnet = pn->prnnet; prnnet; prnnet = prnnet->prnnet )
    {
```

37

Appendix A

```
/* Check all wires */
/**************************************************************/ for ( pw = prnnet->pw; pw; pw = pw->pw )
    {
        if (( layer_code & pw->pwtype->code ) == 0 ) continue;

/* consider same layer wires only */ mu_get_wire_outline
        ( pw, &oxa, &oya, &oxb, &oyb, bloat_x, bloat_y );

if ( mu_check_overlaps( oxa, oya, oxb, oyb ) )
        {
            pe = ( ELEMENTLIST * )ma_alloc( sizeof( ELEMENTLIST ));
            pe->type = WIRE_ELEMENT;
            (pe->e).pw = pw;
            pe->pnext = elements;
            elements = pe;
        }
    }
} for ( pb = chip.pcb; pb; pb = pb->pb )
{
    /* Check all chip Blocks */
    /**************************************************************/ if (( layer_code & pb->code ) == 0 ) continue;

/* consider same layer blocks only */
    mu_get_block_outline
    ( pb, &oxa, &oya, &oxb, &oyb, bloat_x, bloat_y );

if ( mu_check_overlaps( oxa, oya, oxb, oyb ) )
    {
        pe = ( ELEMENTLIST * )ma_alloc( sizeof( ELEMENTLIST ));
        pe->type = BLOCK_ELEMENT;
        (pe->e).pb = pb;
        pe->pnext = elements;
        elements = pe;
    }
} for ( pr = chip.pr; pr; pr = pr->prrgn )
for ( pb = pr->prb; pb; pb = pb->pb )
{
    /* Check all cell blocks */
    /**************************************************************/
```

38

Appendix A

```
    if (( layer_code & pb->code ) == 0 ) continue;

/* consider same layer blocks only */
    mu_get_block_outline
    ( pb, &oxa, &oya, &oxb, &oyb, bloat_x, bloat_y );

if ( mu_check_overlaps( oxa, oya, oxb, oyb ) )
    {
      pe = ( ELEMENTLIST * )ma_alloc( sizeof( ELEMENTLIST ));
      pe->type = BLOCK_ELEMENT;
      (pe->e).pb = pb;
      pe->pnext = elements;
      elements = pe;
    }
  }
}

/*****************************************************************/
mu_check_overlaps( oxa, oya, oxb, oyb )
int    oxa, oya, oxb, oyb;
{ int     group_start, group_end;
  int     outline_a, outline_b;
  int     wire_start, wire_end;
  int     i;
  int     overlaped = FALSE;
  WIRELIST  *pw;

/*****************************************************************/
switch( x_y )
{
case X:

outline_a =   oya;
  outline_b =   oyb;
  wire_start =  oxa;
  wire_end =    oxb;
  break;

case Y:

outline_a =   oxa;
  outline_b =   oxb;
  wire_start =  oya;
  wire_end =    oyb;
  break;
```

39
Appendix A

```c
  } hash_groups
   ( &group_start, &group_end, outline_a, outline_b );

/* for all overlaped groups */
  /*************************************************************/ for ( i = group_start; i <= group_end && !overlaped; i++ )
  {
    for ( pw = meshes[i].wirelist; pw && !overlaped; pw = pw->pnext )
    {

/* no overlap */
      /*************************************************************/ if ( wire_start >= pw->end || wire_end <= pw->start )
      continue;

overlaped = TRUE;

}
  } return( overlaped );
}

/*****************************************************************/
MU_remove_redundancy( pl )
LAYER*pl;
{
  int    i, oxa, oya, oxb, oyb;
  int    bloat = thresh;
  ELEMENTLIST **pe;

void   mu_get_wire_outline(),
         mu_get_via_outline(),
         mu_get_pin_outline(),
         mu_get_block_outline();

/* for all elements in physical view with potential overlaps, making marks */ for ( pe = &elements; *pe; pe = &((*pe)->pnext) )
  { switch( (*pe)->type )
    {
    case WIRE_ELEMENT:
```

40
                                  Appendix A

```
        mu_get_wire_outline
          ( ((*pe)->e).pw, &oxa, &oya, &oxb, &oyb, 0, 0 );
        break;

case VIA_ELEMENT:

mu_get_via_outline
          ( ((*pe)->e).pv, &oxa, &oya, &oxb, &oyb, 0, 0 );
        break;

case PIN_ELEMENT:

mu_get_pin_outline
          ( ((*pe)->e).pp, &oxa, &oya, &oxb, &oyb, 0, 0 );
        break;

case BLOCK_ELEMENT:

mu_get_block_outline
          ( ((*pe)->e).pb, &oxa, &oya, &oxb, &oyb, 0, 0 );
        break;
    } switch( x_y )
    {
    case X:
        mu_making_marks( oxa, oya - bloat, oxb, oya, LEFT_BOT );
        mu_making_marks( oxa, oyb, oxb, oyb + bloat, RIGHT_TOP );
        break;

case Y:
        mu_making_marks( oxa - bloat, oya, oxa, oyb, LEFT_BOT );
        mu_making_marks( oxb, oya, oxb + bloat, oyb, RIGHT_TOP );
        break;
    }

} mu_sort_segments();
  mu_merge_segments();

mu_delete_short_segments( thresh );

}

/****************************************************************/ mu_making_marks( oxa, oya, oxb, oyb, flag )
int oxa, oya, oxb, oyb;
int flag;
```

41
Appendix A

```
{
    int     group_start, group_end;
    int     outline_a, outline_b;
    int     wire_start, wire_end;
    int     new_wire_start, new_wire_end;
    int     i, del, exit_loop;
    int     marked_already;
    WIRELIST    *new_wire, *mu_add_segment();
    WIRELIST    **pw;

/******************************************************************/ switch( x_y )
{
case X:

outline_a =     oya;
    outline_b =     oyb;
    wire_start =    oxa;
    wire_end =      oxb;
    break;

case Y:

outline_a =     oxa;
    outline_b =     oxb;
    wire_start =    oya;
    wire_end =      oyb;
    break;
} hash_groups
( &group_start, &group_end, outline_a, outline_b );

/* for all overlaped groups */
/******************************************************************/ for ( i = group_start; i <= group_end; i++ )
{
    exit_loop = FALSE;
    for ( pw = &(meshes[i].wirelist); *pw && !exit_loop;
    pw = (del) ? pw : &((*pw)->pnext) )
    { del = FALSE;

/* ignore redundant marks */ switch( flag )
```

Appendix A

```c
{
case LEFT_BOT :
  if ( (*pw)->rt_mark ) continue;
  break;

case RIGHT_TOP :
  if ( (*pw)->lb_mark ) continue;
  break;

case BOTH :
  if ( (*pw)->rt_mark ) continue;
  break;
} marked_already = mu_get_mark( *pw, flag );

/* no overlap */
/*****************************************************************/ if ( wire_start >= (*pw)->end || wire_end <= (*pw)->start )
{ /* do nothing */ }

/* partially covered at lower end */
/*****************************************************************/ else if ( wire_start > (*pw)->start && wire_end >= (*pw)->end )
{ if ( !marked_already )
  {
   new_wire = mu_add_segment( i, wire_start, (*pw)->end );
   mu_mark_wire( new_wire, flag );
   if ( pw == &(meshes[i].wirelist))
   pw = &(new_wire->pnext);
  }

(*pw)->end = wire_start;

}

/* partially covered at higher end */
/*****************************************************************/ else if ( wire_end < (*pw)->end && wire_start <= (*pw)->start )
{ if ( !marked_already )
  {
   new_wire = mu_add_segment( i, (*pw)->start, wire_end );
   mu_mark_wire( new_wire, flag );
```

43
Appendix A

```
    if ( pw == &(meshes[i].wirelist))
    pw = &(new_wire->pnext);
  }

(*pw)->start = wire_end;
}

/* crossed by wire */
/****************************************************************/ else if ( wire_end < (*pw)->end && wire_start > (*pw)->start )
{ new_wire = mu_add_segment( i, wire_end, (*pw)->end );
  new_wire->lb_mark = (*pw)->lb_mark;
  new_wire->rt_mark = (*pw)->rt_mark;
  if ( pw == &(meshes[i].wirelist))
  pw = &(new_wire->pnext);

if ( !marked_already )
  {
   new_wire = mu_add_segment( i, wire_start, wire_end );
   mu_mark_wire( new_wire, flag );
   if ( pw == &(meshes[i].wirelist))
   pw = &(new_wire->pnext);
  }

(*pw)->end = wire_start;
  exit_loop = TRUE;
}

/* fully covered */
/****************************************************************/ else if ( wire_start <= (*pw)->start && wire_end >= (*pw)->start )
{
  if ( !marked_already )
  {
   mu_mark_wire( *pw, flag );
  }
  else
  {
   mu_del_segment( pw, i );
   del = TRUE;
  }
}

}
}
```

44
Appendix A

45
Appendix A

"mupass3.c"

```c
#ifndef lint
static char mupass3_c[] = "$Header$";
#endif

/******************************************************************** define MUEXTERN extern
include "mu.h"

/********************************************************************/

MU_making_rings( pl )
LAYER *pl;
{
  int    i, oxa, oya, oxb, oyb;
  int    bloat_x = bloat1_x + bloat2_x;
  int    bloat_y = bloat1_y + bloat2_y;
  ELEMENTLIST *pe;

void mu_get_wire_outline(),
    mu_get_via_outline(),
    mu_get_pin_outline(),
    mu_get_block_outline();

mu_clean_marks();

/* for all elements in physical view with potential overlaps, making marks */ for ( pe = elements; pe; pe = pe->pnext )
  {
    switch( pe->type )
    {
    case WIRE_ELEMENT:

mu_get_wire_outline
        ( pe->e.pw, &oxa, &oya, &oxb, &oyb, 0, 0 );
      break;

case VIA_ELEMENT:

mu_get_via_outline
```

Appendix A

```
    ( pe->e.pv, &oxa, &oya, &oxb, &oyb, 0, 0 );
    break;

case PIN_ELEMENT:

mu_get_pin_outline
    ( pe->e.pp, &oxa, &oya, &oxb, &oyb, 0, 0 );
    break;

case BLOCK_ELEMENT:

mu_get_block_outline
    ( pe->e.pb, &oxa, &oya, &oxb, &oyb, 0, 0 );
    break;
} if ( !line )

mu_making_marks
  ( oxa - bloat_x, oya - bloat_y, oxb + bloat_x, oyb + bloat_y, BOTH );

else switch( x_y )
  {
  case X:

mu_making_marks
  ( oxa, oya - bloat_y, oxb, oya, BOTH );

mu_making_marks
  ( oxa, oyb, oxb, oyb + bloat_y, BOTH );

break;

case Y:

mu_making_marks
  ( oxa - bloat_x, oya, oxa, oyb, BOTH );

mu_making_marks
  ( oxb, oya, oxb + bloat_x, oyb, BOTH );

break;
  }

} mu_remove_unmarked_wires();

mu_sort_segments();
```

47
Appendix A

```
  mu_merge_segments();
  mu_delete_short_segments( wire_width * 2 + 1 );
}

/******************************************************************/
mu_clean_marks()
{ int    i;
 WIRELIST *pw;

for ( i = 0; i < no_of_groups; i++ )
 { for ( pw = meshes[i].wirelist; pw; pw = pw->pnext )
   {
      pw->rt_mark = pw->lb_mark = FALSE;
   }

}

}

/******************************************************************/
mu_remove_unmarked_wires()
{ int         i;
 WIRELIST    **pw;

for ( i = 0; i < no_of_groups; i++ )
 { for ( pw = &(meshes[i].wirelist); (*pw); )
   {
      if ( !(*pw)->rt_mark )
         mu_del_segment( pw, i );
      else
         pw = &((*pw)->pnext);
   }

}

}
```

48
Appendix A

"muspace.c"

```c
#ifndef lint
static char muspace_c[] = "$Header$";
#endif

/*******************************************************************/ define MUEXTERN extern
include "mu.h"

/*******************************************************************
 * Subroutine for computing coverage for all layers
 *******************************************************************/ double MU_test_requirement( pl )
LAYER*pl;
{ int     i, err;
    double  utilization;
    double  MU_calculate_coverage();

msgout( "Calculate estimated metal coverage. . .\n" );

utilization = MU_calculate_coverage( pl );

if ( utilization < lower_percent/100.0 )
    {
    sprintf( msg, "Metal utilization is lower than %7.2f.\n",
    lower_percent/100.0 );
    msgout( msg );
    msgout( "Lonley wires might exist in this layer\n\n" );
    } else
    {
    sprintf( msg, "Metal utilization is higher than %7.2f.\n",
    lower_percent/100.0 );
    msgout( msg );
    msgout( "There might not be any loney wires in this layer.\n\n" );
    } return( utilization*100.0 );
```

49

Appendix A

}

/******************************************************************/

```c
double MU_calculate_coverage( pl )
LAYER *pl;
{ double  chip_oxa, chip_oya, chip_oxb, chip_oyb;
    double  chip_area;
    double  dx, dy;
    double  metal_area;
    double  wire_area;
    double  block_area;
    double  est_block_area;
    double  percentage;
    int     i, oxa, oya, oxb, oyb;
    int     layer_code = pl->code;
    NET     *pn;
    WIRE    *pw;
    BLOCK   *pb;
    REGION  *pr;
    RGNNET  *prnnet;
    void    mu_get_wire_outline(),
            mu_get_via_outline(),
            mu_get_pin_outline(),
            mu_get_block_outline(),
            mu_remove_overlaps();
    char    msg[BSIZE];

if ( strcmp( pl->name, "FM" ) == 0 )
    percentage = 0.35;
    else if ( strcmp( pl->name, "SM" ) == 0 )
    percentage = 0.50;
    else
    percentage = 1.0;

chip_oxa = ((double)chip.oxa) / 1000.0;
    chip_oya = ((double)chip.oya) / 1000.0;
    chip_oxb = ((double)chip.oxb) / 1000.0;
    chip_oyb = ((double)chip.oyb) / 1000.0;

chip_area = (chip_oxb - chip_oxa) * (chip_oyb - chip_oya);

metal_area     =
    wire_area      =
    block_area     =
    est_block_area = 0.0;

/* for all nets */
    for ( pn = nethead; pn; pn = pn->pn )
```

50

Appendix A

```
{ for ( prnnet = pn->prnnet; prnnet; prnnet = prnnet->prnnet )
   {

/* Count for all wires */
     /************************************************************/ for ( pw = prnnet->pw; pw; pw = pw->pw )
     {
       if (( layer_code & pw->pwtype->code ) == 0 ) continue;

/* consider same layer wires only */ mu_get_wire_outline
       ( pw, &oxa, &oya, &oxb, &oyb, 0, 0 );

dx = (float)( oxb - oxa );
       dy = (float)( oyb - oya );

wire_area += ( dx * dy ) / 1000000.0;
     }

}
} for ( pb = chip.pcb; pb; pb = pb->pb )
{
   /* Count for all chip blocks */
   /************************************************************/ if (( layer_code & pb->code ) == 0 ) continue;

/* consider same layer blocks only */
   mu_get_block_outline
   ( pb, &oxa, &oya, &oxb, &oyb, 0, 0 );

dx = (float)( oxb - oxa );
   dy = (float)( oyb - oya );

if ( dx > 10000.0 && dy > 10000.0 )
     est_block_area += ( dx * dy ) / 1000000.0 * percentage;
   else
     est_block_area += ( dx * dy ) / 1000000.0;

block_area += ( dx * dy ) / 1000000.0;
} for ( pr = chip.pr; pr; pr = pr->prrgn )
for ( pb = pr->prb; pb; pb = pb->pb )
{
   /* Count for all cell Blocks */
```

51

Appendix A

/******************************************************/

```
    if (( layer_code & pb->code ) == 0 ) continue;

/* consider same layer blocks only */
    mu_get_block_outline
    ( pb, &oxa, &oya, &oxb, &oyb, 0, 0 );

dx = (float)( oxb - oxa );
    dy = (float)( oyb - oya );

if ( dx > 10000.0 && dy > 10000.0 )
        est_block_area += ( dx * dy ) / 1000000.0 * percentage;
    else
        est_block_area += ( dx * dy ) / 1000000.0;

block_area += ( dx * dy ) / 1000000.0;
} sprintf( msg, "Estimated wire area : %8.3f.\n", wire_area/chip_area );
msgout( msg );

sprintf( msg, "Total block area : %8.3f.\n", block_area/chip_area );
msgout( msg );

sprintf( msg, "Estimated block area : %8.3f.\n", est_block_area/chip_area );
msgout( msg );

metal_area = wire_area + est_block_area;

sprintf( msg, "\n%s'%s'%s%8.3f.\n\n",
"Estamited coverage for layer ", pl->name, " is ",
metal_area / chip_area );
msgout( msg );

return( metal_area / chip_area );
}
```

/*********************************************************************/

52
Appendix A

"muwires.c"

```c
#ifndef lint
static char muwires_c[] = "$Header$";
#endif

/*********************************************************************** define MUEXTERN extern
include "mu.h"

static WIRETYPE    *pwpref;
static WIRETYPE    *pwmark;
static NET+        *pguard;
static int         seperation, mark_len, mark_width;
static int         offset;
static int         total_no_of_segs;
static int         no_of_wires_inserted;
static int         no_of_segs_shorted;
static int         no_of_removed;
static int         interrupt;

/**********************************************************************/

MU_insert_wires( pl )
LAYER *pl;
{
 int   errcd;
 int   i, j;
 int   dist;
 WIRELIST  *pw;

/*** Initialize seperation and offsets... ************/ switch( wire_type )
 {
 case 1: /* 1G wire */
   pwpref = pl->pwtype;
   break;

case 2: /* 2G wire */
   pwpref = pl->pwtype->pwtype;
   break;

case 3: /* 3G wire */
   pwpref = pl->pwtype->pwtype->pwtype;
```

Appendix A

```
      break;
    } if ( pattern == 1 )
    {
      pwmark = pl->pwtype;  /* 1 G wire */
      seperation = wire_width * 10;
      mark_len = wire_width * 8;
      mark_width = pwmark->width / 2;
      offset = wire_width + mark_width;
    }
    else if ( pattern == 2 )
    {
      pwmark = pwpref;
      seperation = wire_width * 8;
      mark_width = pwpref->width / 2;
      offset = pwpref->width / 4;
      if ( (offset % 200) != 0 )
        offset = offset + ( 200 - (offset % 200) );
    } mu_name_net( "$VDD$", &pguard, &errcd );
    if ( errcd != 0 ) MU_wipeout( "Fail to find net $VDD$" );

/******* Start inserting wires ******************************/
    dist = ( x_y == X ) ? area_ys : area_xs;

interrupt= 0;
    total_no_of_segs= 0;
    no_of_wires_inserted= 0;
    no_of_segs_shorted= 0;

for ( i = 0; i < no_of_groups; i++ )
    { total_no_of_segs += meshes[i].no_of_wires;

for ( pw = meshes[i].wirelist; pw; pw = pw->pnext )
      {
        switch( pattern )
        {
        case 0: /* straight wire */ mu_insert_straight_wire( pw, dist );
          continue;
          break;

case 1: /* symmetric markers */
```

54
Appendix A

```
      mu_insert_straight_wire( pw, dist );
      mu_make_type1_marker( pw, dist );
      break;

case 2: /* draged makers */ mu_make_type2_marker( pw, dist );
      break;
    }
   } dist += mesh;
 } sprintf( msg, "\n\n\ts\td\n\ts\td\n\ts\td\n\n",

"Total no of segments : ", total_no_of_segs,
    "Total no of wires inserted : ", no_of_wires_inserted,
    "Total no of wires shorted : ", no_of_segs_shorted );

msgout( msg );

}

/****************************************************************/ mu_insert_straight_wire( pw, dist )
WIRELIST *pw;
int   dist;
{
 int   start, end;

start = pw->start + wire_width;
 end   = pw->end - wire_width;

if ( start >= end ) return;

switch( x_y )
 {
 case X:

mu_pv_insert_wire( pwpref, start, dist, end, dist );
   break;

case Y:

mu_pv_insert_wire( pwpref, dist, start, dist, end );
   break;
 }

}
```

55

Appendix A

```
/*********************************************************************/ mu_make_type1_marker( pw, dist )
WIRELIST *pw;
int    dist;
{ int  start, end;
  int  mark_start, mark_end;

start  = pw->start + wire_width;
  end    = pw->end - wire_width;

for ( mark_start = start; mark_start < end; mark_start += seperation )
  {
    mark_end = mark_start + mark_len;

if ( mark_end > end ) mark_end = end;
    if ( mark_start + mark_width >= mark_end - mark_width ) continue;

switch( x_y )
    { /* insert left markers */
    case X:

mu_pv_insert_wire( pwmark,
       mark_start + mark_width, dist - offset,
       mark_end - mark_width, dist - offset );
       break;

case Y:

mu_pv_insert_wire( pwmark,
       dist - offset, mark_start + mark_width,
       dist - offset, mark_end - mark_width );
       break;
    } switch( x_y )
    { /* insert right markers */
    case X:

mu_pv_insert_wire( pwmark,
       mark_start + mark_width, dist + offset,
       mark_end - mark_width, dist + offset );
       break;

case Y:

mu_pv_insert_wire( pwmark,
       dist + offset, mark_start + mark_width,
```

Appendix A

```
      dist + offset, mark_end - mark_width );
      break;
   }

}
}

/*******************************************************************/ mu_make_type2_marker( pw, dist )
WIRELIST *pw;
intdist;
{ int    start, end;
int    mark_start, mark_end;
int    toggle = 0;

start  = pw->start;
end    = pw->end;

for ( mark_start = start; mark_start < end; mark_start += seperation )
{
  mark_end = mark_start + seperation;

if ( mark_end > end ) mark_end = end;
  if ( mark_start + mark_width >= mark_end - mark_width ) continue;

if ( toggle == 0 )
  {
   switch( x_y )
   { /* insert left markers */
   case X:

mu_pv_insert_wire( pwpref,
     mark_start + mark_width, dist - offset,
     mark_end - mark_width, dist - offset );
     break;

case Y:

mu_pv_insert_wire( pwpref,
     dist - offset, mark_start + mark_width,
     dist - offset, mark_end - mark_width );
     break;
  } toggle = 1;
  }
  else
  {
```

57
Appendix A

```
    switch( x_y )
    { /* insert right markers */
    case X:

mu_pv_insert_wire( pwpref,
       mark_start + mark_width, dist + offset,
       mark_end - mark_width, dist + offset );
       break;

case Y:

mu_pv_insert_wire( pwpref,
       dist + offset, mark_start + mark_width,
       dist + offset, mark_end - mark_width );
       break;
    } toggle = 0;
    }

}
}

/*******************************************************************/ mu_pv_insert_wire( pwtype, xb, yb, xe, ye )
WIRETYPE*pwtype;
int    xb, yb, xe, ye;
{
 int j, errcd;

split_wire( pguard, pwtype, xb, yb, xe, ye, &errcd );

if ( errcd != 0 )
 {
 sprintf( msg, "Shorted at (%d %d %d %d)\n", xb, yb, xe, ye );
 msgout( msg );
 no_of_segs_shorted++;
 }
 else
 no_of_wires_inserted++;

views_modified = TRUE;

if ( interrupt == 0 ) msgout( "." );
 interrupt = ( interrupt == 499 ) ? 0 : interrupt + 1;

}

/*******************************************************************/
```

Appendix A

```
mu_name_net( name, pnet, errcd )
char*name;
NET**pnet;
int*errcd;
{

NET*pn;

for ( pn = nethead; pn; pn = pn->pn )
  {
    if ( strcmp( name, pn->name ) == 0 )
    {
     *errcd = 0;
     *pnet = pn;
     return;
    }
  }

*errcd = 1;
 *pnet = (NET *)NULL;
  return;

}
```

59
Appendix A

"muutil.c"

```c
#ifndef lint
static char muutil_c[] = "$Header$";
#endif

/*******************************************************************/ define MUEXTERN extern
include "mu.h"

/*******************************************************************/
void mu_get_wire_outline( pw, oxa, oya, oxb, oyb, bloat_x, bloat_y )
WIRE *pw;
int  *oxa, *oya, *oxb, *oyb;
int  bloat_x, bloat_y;
{ int width = pw->pwtype->width / 2;

*oxa = pw->xa - width - bloat_x;
    *oya = pw->ya - width - bloat_y;
    *oxb = pw->xb + width + bloat_x;
    *oyb = pw->yb + width + bloat_y;

}

/*******************************************************************/
void mu_get_via_outline( pv, oxa, oya, oxb, oyb, bloat_x, bloat_y )
VIA  *pv;
int  *oxa, *oya, *oxb, *oyb;
int  bloat_x, bloat_y;
{

*oxa = pv->x + pv->pvtype->hxa - bloat_x;
    *oya = pv->y + pv->pvtype->hya - bloat_y;
    *oxb = pv->x + pv->pvtype->hxb + bloat_x;
    *oyb = pv->y + pv->pvtype->hyb + bloat_y;

}
```

60
Appendix A

```
/************************************************************/ void mu_get_pin_outline( pp, oxa, oya, oxb, oyb, bloat_x, bloat_y )
PIN   *pp;
int   *oxa, *oya, *oxb, *oyb;
int   bloat_x, bloat_y;
{

*oxa = pp->x + pp->pitype->hxa - bloat_x;
   *oya = pp->y + pp->pitype->hya - bloat_y;
   *oxb = pp->x + pp->pitype->hxb + bloat_x;
   *oyb = pp->y + pp->pitype->hyb + bloat_y;

}

/************************************************************/ void mu_get_block_outline( pb, oxa, oya, oxb, oyb, bloat_x, bloat_y )
BLOCK  *pb;
int    *oxa, *oya, *oxb, *oyb;
int    bloat_x, bloat_y;
{

*oxa = pb->oxa - bloat_x;
   *oya = pb->oya - bloat_y;
   *oxb = pb->oxb + bloat_x;
   *oyb = pb->oyb + bloat_y;

}

/************************************************************/ hash_groups( group_start, group_end, outline_a, outline_b )
int    *group_start, *group_end;
int    outline_a, outline_b;
{

*group_start = ( outline_a - ref ) / mesh;

while ((((*group_start) * mesh + wire_width + ref ) > outline_a )
(*group_start)--;
(*group_start)++;

*group_end = ( outline_b - ref ) / mesh;

while ((((*group_end) * mesh - wire_width + ref ) < outline_b )
(*group_end)++;
(*group_end)--;

if ( *group_start < 0 ) *group_start = 0;
```

Appendix A

```c
    if ( *group_end >= no_of_groups ) *group_end = no_of_groups - 1;
}

/***************************************************************/

WIRELIST *mu_add_segment( i, new_wire_start, new_wire_end )
inti;
intnew_wire_start, new_wire_end;
{

WIRELIST *new_wire =
    (WIRELIST *)ma_alloc( sizeof( WIRELIST ));

new_wire->start = new_wire_start;
    new_wire->end = new_wire_end;
    new_wire->pnext = meshes[i].wirelist;
    new_wire->lb_mark = FALSE;
    new_wire->rt_mark = FALSE;

meshes[i].wirelist = new_wire;
    (meshes[i].no_of_wires)++;

return( new_wire );

}

/***************************************************************/ mu_del_segment( pw, i )
WIRELIST **pw;
inti;
{

WIRELIST *pw_free;

pw_free = *pw;
    *pw = (*pw)->pnext;
    ma_free( pw_free );
    (meshes[i].no_of_wires)--;

}

/***************************************************************/ mu_check_segment( pw, i )
WIRELIST **pw;
int      i;
{
```

62
Appendix A

```
    if ( (*pw)->end - (*pw)->start < thresh )
    {
     mu_del_segment( pw, i );
     return( TRUE );
    } return( FALSE );

}

/*****************************************************************/ mu_mark_wire( pw, flag )
WIRELIST   *pw;
int        flag;
{ switch( flag )
 {
 case LEFT_BOT  : pw->rt_mark = TRUE; break;
 case RIGHT_TOP : pw->lb_mark = TRUE; break;
 case BOTH      : pw->rt_mark = TRUE; break;
 }

}

/*****************************************************************/ mu_get_mark( pw, flag )
WIRELIST *pw;
int      flag;
{ switch( flag )
 {
 case LEFT_BOT  : return( pw->lb_mark ); break;
 case RIGHT_TOP : return( pw->rt_mark ); break;
 case BOTH      : return( pw->rt_mark ); break;
 }

}

/*****************************************************************/ mu_sort_segments()
{

WIRELIST   **pw, **sort_buf, *temp;
 int        i, j, k, l;
```

Appendix A

```c
int swap;

for ( i = 0; i < no_of_groups; i++ )
{
  if ( meshes[i].no_of_wires == 0 ) continue;

sort_buf =
  (WIRELIST **)ma_alloc( sizeof( WIRELIST * ) * ( meshes[i].no_of_wires + 1));

/* copy linked list to buffer */ for ( pw = &(meshes[i].wirelist), j = 0; *pw; pw = &((*pw)->pnext) )
    sort_buf[j++] = *pw;
  sort_buf[j] = (WIRELIST *)NULL;

for ( k = j - 1, swap = TRUE; k > 0 && swap; k-- )
  {
    swap = FALSE;
    for ( l = 0; l < k; l++ )
    {
      if ( sort_buf[l]->start > sort_buf[l+1]->start )
      {
        swap = TRUE;
        temp = sort_buf[l+1];
        sort_buf[l+1] = sort_buf[l];
        sort_buf[l] = temp;
      }
    }
  } for ( pw = &(meshes[i].wirelist), k = 0; k <= j; k++, pw = &((*pw)->pnext) )
    *pw = sort_buf[k];

ma_free( sort_buf );
}

}

/*******************************************************************/
mu_merge_segments()
{

WIRELIST   **pw;
int        i;

for ( i = 0; i < no_of_groups; i++ )
{
  for ( pw = &(meshes[i].wirelist); *pw; )
  {
```

64
Appendix A

```
        if ( (*pw)->pnext )
        {
          if ( (*pw)->end == (*pw)->pnext->start )
          {
            (*pw)->pnext->start = (*pw)->start;
            (*pw)->pnext->rt_mark |= (*pw)->rt_mark;
            (*pw)->pnext->lb_mark |= (*pw)->lb_mark;
            mu_del_segment( pw, i );
          }
          else
            pw = &((*pw)->pnext);
        }
        else
          pw = &((*pw)->pnext);

}
    }
  }

/**************************************************************/
mu_delete_short_segments( thresh )
int    thresh;
{

WIRELIST    **pw;
  int         i;

/* delete short segments */ for ( i = 0; i < no_of_groups; i++ )
  {
    for ( pw = &(meshes[i].wirelist); *pw; )
    { if ( (*pw)->end - (*pw)->start < thresh )
        mu_del_segment( pw, i );
      else
        pw = &((*pw)->pnext);

}
  }

}
```

We claim:

1. A method of forming a metallization pattern on a semiconductor chip, comprising the steps of:
   (a) designing a metallization pattern including a plurality of working lines having different spacings therebetween;
   (b) computing a surface area of said metallization pattern;
   (c) comparing said surface area with a predetermined surface area range;
   (d) if said surface area is not within said surface area range, modifying said metallization pattern by selectively revising wiring relationships within said metallization pattern and repeating steps (b) and (c) until said surface area is within said surface area range;
   (e) forming a metal layer on the semiconductor chip; and
   (f) processing said metal layer by selectively removing portions of said metal layer to form said metallization pattern on the semiconductor chip;
   in which said surface area range is predetermined such that said processing in step (f) occurs substantially homogeneously.

2. A method as in claim 1, in which:
   said processing in step (f) comprises dry etching; and
   said surface area ranges is approximately 17% to 100% of a surface area of the semiconductor chip.

3. A method as in claim 1, in which said processing in step (f) comprises reactive ion etching.

4. A method as in claim 3, in which said surface area range is approximately 17% to 100% of a surface area of the semiconductor chip.

5. A method as in claim 1, in which:
   said processing in step (f) comprises dry etching; and
   said surface area range is predetermined such that said processing in step (f) occurs substantially anisotropically.

6. A method as in claim 1, in which:
   said processing in step (f) comprises reactive ion etching; and
   said surface area range is predetermined such that said processing in step (f) occurs substantially anisotropically.

7. A method as in claim 1, in which:
   said surface area range is between a predetermined value and 100% of a surface area of the semiconductor chip; and
   step (d) comprises adding dummy lines that are not connected to said working lines to said metallization pattern.

8. A method as in claim 1, wherein selectively revising wiring relationships comprises:
   (d1) initializing a mesh pattern of local wires with physical wires;
   (d2) removing any overlap between said local and said physical wires;
   (d3) removing portions of said local wires which are within a first predetermined distance of said physical wires;
   (d4) creating a boundary of a second predetermined distance surrounding said physical wires; and
   (d5) removing segments of said local wires which are outside are boundary.

9. A method as in claim 1, wherein selectively revising wiring relationships comprises:
   (d1) initializing a wiring pattern;
   (d2) removing portions of said wiring pattern and wires located within said metallization pattern according to a predetermined criteria;
   (d3) creating a boundary of a predetermined distance surrounding said wires within said metallization pattern; and
   (d4) removing segments of said wiring pattern which are outside said boundary.

10. A method of forming a metallization pattern on a semiconductor chip, comprising the steps of:
    (a) designing a metallization pattern including a plurality of lines having different spacings therebetween, and a surface area within a predetermined surface area range;
    (b) selectively revising object relationships within said metallization pattern if said surface area is not within said surface area range;
    (c) forming a metal layer on the semiconductor chip; and
    (d) processing said metal layer by selectively removing portions of said metal layer to form said metallization pattern on the semiconductor chip;
    in which said surface area range is predetermined such that said processing in step (d) occurs substantially homogeneously.

11. A method as in claim 10, in which:
    said processing in step (c) comprises dry etching; and
    said surface area range is approximately 17% to 100% of a surface area of the semiconductor chip.

12. A method as in claim 10, in which said processing in step (f) comprises reactive ion etching.

13. A method as in claim 12, in which said surface area range is approximately 17% to 100% of a surface area of the semiconductor chip.

14. A method as in claim 10, in which:
    said processing in step (c) comprises dry etching; and
    in which said surface area range is predetermined such that said processing in step (c) occurs substantially anisotropically.

15. A method as in claim 10, in which:
    said processing in step (c) comprises reactive ion etching; and
    in which said surface area range is predetermined such that said processing in step (c) occurs substantially anisotropically.

16. A method as in claim 10, wherein said selectively revising step comprises:
    (b1) initializing a mesh pattern of local wires with physical wires;
    (b2) removing an overlap between said local and said physical wires;
    (b3) removing portions of said local wires which are within a first predetermined distance of said physical wires;
    (b4) creating a boundary of a second predetermined distance surrounding said physical wires; and
    (b5) removing segments of said local wires which are outside said boundary.

17. A method as in claim 10, wherein selectively revising wiring relationships comprises:
    (b1) initializing a wiring pattern;
    (b2) removing portions of said wiring pattern and wires located within said metallization pattern according to a predetermined criteria;

(b3) creating a boundary of a predetermined distance surrounding said wires within said metallization pattern; and (b4) removing segments of said wiring pattern which are outside said boundary.

18. A method of forming a metallization pattern on a semiconductor chip, comprising the steps of:

(a) designing a metallization pattern including a plurality of lines such that different areas of the semiconductor chip have different densities of said lines, with all of said densities being within a predetermined density range;

(b) selectively revising wiring relationships within said metallization pattern based on a predetermined standard;

(c) forming a metal layer on the semiconductor chip; and (d) processing said metal layer by selectively removing portions of said metal layer to form said metallization pattern on the semiconductor chip;

in which said density range is predetermined such that said processing in step (d) occurs substantially homogeneously.

19. A method as in claim 18, in which:

said processing in step (c) comprises dry etching; and in which said density range is predetermined such that said processing in step (c) occurs substantially anisotropically.

20. A method as in claim 18, in which:

said processing in step (c) comprises reactive ion etching; and in which said density range is predetermined such that said processing in step (c) occurs substantially anisotropically.

21. A method as in claim 18, wherein said metallization pattern further comprises a surface area within a predetermined surface area range, and said predetermined standard comprises said surface area not being within said surface area range.

22. A method as in claim 18, wherein said selectively revising step comprises:

(b1) initializing a mesh pattern of local wires with physical wires;

(b2) removing any overlap between said local and said physical wires;

(b3) removing portions of said local wires which are within a first predetermined distance of said physical wires;

(b4) creating a boundary of a second predetermined distance surrounding said physical wires; and (b5) removing segments of said local wires which are outside said boundary.

23. A method as in claim 18, wherein selectively revising wiring relationships comprises:

(b1) initializing a wiring pattern;

(b2) removing portions of said wiring pattern and wires located within said metallization pattern according to a predetermined criteria;

(b3) creating a boundary of a predetermined distance surrounding said wires within said metallization pattern; and (b4) removing segments of said wiring pattern which are outside said boundary.

24. A method of forming a metallization pattern on a semiconductor chip, comprising the steps of:

(a) designing a metallization pattern including a plurality of lines that have different widths, with all of said widths being within a predetermined width range;

(b) forming a metal layer on the semiconductor chip; and (c) processing said metal layer by selectively removing portions of said metal layer to form said metallization pattern on the semiconductor chip;

in which said width range is predetermined such that said processing in step (c) occurs substantially homogeneously.

25. A method as in claim 24, in which:

said processing in step (c) comprises dry etching; and in which said width range is predetermined such that said processing in step (c) occurs substantially anisotropically.

26. A method as in claim 24, in which:

said processing in step (c) comprises reactive ion etching; and in which said width range is predetermined such that said processing in step (c) occurs substantially anisotropically.

27. A method as in claim 24, further comprising the steps of:

computing a surface area of said metallization pattern;

comparing said surface area with a predetermined surface area range; and selectively revising wiring relationships within said metallization pattern if said surface area is not within said surface area range;

wherein said computing, comparing, and selectively modifying steps precede said metal layer forming step.

28. A method as in claim 27, wherein selectively revising wiring relationships comprises:

initializing a mesh pattern of local wires with physical wires;

removing any overlap between said local and said physical wires;

removing portions of said local wires which are within a first predetermined distance of said physical wires;

creating a boundary of a second predetermined distance surrounding said physical wires; and removing segments of said local wires which are outside said boundary.

29. A method as in claim 27, wherein selectively revising wiring relationships comprises:

initializing a wiring pattern;

removing portions of said wiring pattern and wires located within said metallization pattern according to a predetermined criteria;

creating a boundary of a predetermined distance surrounding said wires within said metallization pattern; and removing segments of said wiring pattern which are outside said boundary.

* * * * *